(12) United States Patent
Park et al.

(10) Patent No.: US 7,420,818 B2
(45) Date of Patent: Sep. 2, 2008

(54) MEMORY MODULE HAVING A MATCHING CAPACITOR AND MEMORY SYSTEM HAVING THE SAME

(75) Inventors: Kwang-Soo Park, Suwon-si (KR); Jae-Jun Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 11/368,654

(22) Filed: Mar. 6, 2006

(65) Prior Publication Data

US 2006/0245229 A1 Nov. 2, 2006

(30) Foreign Application Priority Data

Mar. 30, 2005 (KR) ........................ 10-2005-0026626

(51) Int. Cl.
*H05K 1/18* (2006.01)
(52) U.S. Cl. .................. 361/763; 361/728; 361/812
(58) Field of Classification Search .................. 365/200, 365/52; 711/115; 333/26, 32, 33; 361/763, 361/728, 812
See application file for complete search history.

(56) References Cited

U.S. PATENT DOCUMENTS

| 5,272,664 | A | * | 12/1993 | Alexander et al. ............ 365/52 |
| 5,955,889 | A | * | 9/1999 | Taguchi et al. ................ 326/30 |
| 6,477,592 | B1 | * | 11/2002 | Chen et al. .................... 710/52 |
| 6,680,623 | B2 | * | 1/2004 | Hirai et al. .................... 326/30 |
| 7,215,218 | B2 | * | 5/2007 | Burns et al. ................... 333/26 |
| 7,239,216 | B2 | * | 7/2007 | Park et al. ................... 333/126 |
| 2003/0223290 | A1 | * | 12/2003 | Park et al. .................... 365/200 |
| 2004/0024966 | A1 | * | 2/2004 | Lee et al. ..................... 711/115 |
| 2004/0251983 | A1 | * | 12/2004 | Hsu et al. ..................... 333/32 |
| 2005/0265091 | A1 | * | 12/2005 | Tajima et al. ................ 365/200 |

FOREIGN PATENT DOCUMENTS

| JP | 06-161621 | 6/1994 |
| JP | 11-250001 | 9/1999 |
| KR | 10-0228148 | 8/1999 |
| KR | 10-2000-0027551 | 5/2000 |

OTHER PUBLICATIONS

Kim, Yong Hyeon, 100228148 B1, 09-08-199, Samsung Electronics.*

* cited by examiner

*Primary Examiner*—Dean A. Reichard
*Assistant Examiner*—Andargie M Aychillhum
(74) *Attorney, Agent, or Firm*—Mills & Onello LLP

(57) ABSTRACT

A memory module includes: one or more semiconductor memory devices; a plurality of module tabs configured to transmit and receive signals between the one or more semiconductor memory devices and external devices; a data bus configured to transfer signals between data input/output pins of the one or more semiconductor memory devices and the plurality of module tabs; and impedance-matching capacitive elements, each coupled between a line of the data bus and a reference voltage. Accordingly, the memory module and a memory system employing such a module can achieve improved impedance matching, thereby also improving signal integrity.

31 Claims, 10 Drawing Sheets

FREQ(100.0MHz to 1.000GHz)

S(6.6)

MATCHING POINT

FREQ(100.0MHz to 1.000GHz)

FREQ(100.0MHz to 1.000GHz)

MEMORY MODULE HAVING A MATCHING CAPACITOR AND MEMORY SYSTEM HAVING THE SAME

RELATED APPLICATIONS

This application claims priority to Korean Patent Application No. 2005-26626 filed on Mar. 30, 2005 in the Korean Intellectual Property Office, the entire contents of which are herein incorporated by reference in its entirety.

BACKGROUND OF THE INVENTION

1. Field of the Invention

The present invention relates to a memory module and a memory system, and more particularly to a memory module having a matching capacitor and a memory system having the same.

2. Description of the Related Art

The speed of data transmission between semiconductor memory devices and memory controllers is continuously being increased. As the operating speed of memory systems increases, the signal integrity (SI) of signals transmitted and received between the memory modules and the respective memory controllers degrades. Accordingly, various attempts have been made to solve the degradation of signal integrity (SI).

FIG. 1 is a schematic diagram illustrating a conventional memory system.

Referring to FIG. 1, the memory system includes a memory controller 10, memory modules 20 and 30, and sockets 40 and 50 for coupling the memory controller 10 to the memory modules 20 and 30.

The memory modules 20 and 30 are electrically coupled to the sockets 40 and 50 through tabs (not shown) mounted on a board of the memory module. The memory modules 20 and 30 each include dynamic random access memory (DRAM) 22 and 32. The memory controller 10 is coupled to the sockets 40 and 50 through a main bus MBUS, and the sockets 40 and 50 are coupled to each of the data pins DQ (not shown) of the DRAMs 22 and 32 in the memory modules 20 and 30 through data buses DBUS1 and DBUS2. The data buses DBUS1 and DBUS2 that electrically couple the main bus MBUS to each of the DRAMs 22 and 32 include stub resistors 24 and 34 so as to improve the signal integrity (SI).

FIG. 2A is a schematic diagram illustrating a channel topology for measuring a degree of impedance matching of the memory-system shown in FIG. 1 when the DRAM 22 in the memory module 20 operates in a read/write operation mode, and the DRAM 32 in the memory module 30 operates in on-die termination (ODT) mode.

FIG. 2B is a smith chart illustrating the impedance viewed at port P11 shown in FIG. 2A. The smith chart shown in FIG. 2B shows a simulation result in a case where the stub resistors 24 and 34 have a resistance value of about 20Ω, respectively, ODT resistors included in the DRAMs 22 and 32 have a resistance value of about 50Ω, and the data buses DBUS1 and DBUS2 have a resistance value of about 60Ω, respectively. Referring to the smith chart shown in FIG. 2B, impedance in the read/write operation mode of the memory system at high frequency operation is considerably distant from a matching point.

FIG. 3A is a schematic diagram illustrating a channel topology for measuring a degree of impedance matching of the memory system shown in FIG. 1 when the DRAM 22 in the memory module 20 operates in the read/write mode, and the DRAM 32 in the memory module 30 operates in on-die termination (ODT) mode.

FIG. 3B is a smith chart illustrating the impedance viewed at port P12 shown in FIG. 3A. Referring to the smith chart shown in FIG. 3B, impedance in the ODT mode of the memory system at high frequency operation is considerably distant from a matching point.

As described above, in order to improve the signal integrity (SI), the conventional memory system includes stub resistors coupled to each of the data buses of the memory modules; however, impedance mismatching is still present due to the impedance of the data buses DBUS1 and DBUS2, and the semiconductor memory devices i.e., DRAMs 22 and 32.

Korean Patent Publication No. 10-0228148 discloses an impedance matching technique between memory modules by employing an impedance matching circuit having a capacitor positioned between a raw address strobe (RAS) pin and a tab mounted on the memory module.

SUMMARY OF THE INVENTION

Accordingly, the present invention is provided to substantially obviate one or more problems due to limitations and disadvantages of the related art.

Embodiments of the present invention provide a memory module capable of matching impedance of the memory system and capable of improving signal integrity (SI) by including a capacitor for impedance matching on a data bus in each of the memory modules.

Embodiments of the present invention further provide a memory system including such a memory module.

In one aspect, the present invention is directed to a memory module comprising: one or more semiconductor memory devices; a plurality of module tabs configured to transmit and receive signals between the one or more semiconductor memory devices and external devices; a data bus configured to transfer signals between data input/output pins of the one or more semiconductor memory devices and the plurality of module tabs; and impedance-matching capacitive elements, each coupled between a line of the data bus and a reference voltage.

In one embodiment, each line of the data bus includes an impedance-matching resistor.

In another embodiment, each of the impedance-matching capacitive elements includes a capacitor coupled to the corresponding line of the data bus between the impedance-matching resistor and the corresponding one of the one or more semiconductor memory devices.

In another embodiment, each of the impedance-matching capacitive elements includes a capacitor coupled to the corresponding line of the data bus between the impedance-matching resistor and the corresponding one of the plurality of module tabs.

In another embodiment, the reference voltage is a relatively low voltage level provided to the one or more semiconductor memory devices.

In another embodiment, the reference voltage is a relatively high voltage level provided to the one or more semiconductor memory devices.

In another embodiment, each of the impedance-matching capacitive elements comprises a discrete capacitor mounted on a PCB substrate of the memory module.

In another embodiment, each of the impedance-matching capacitive elements employs a PCB substrate of the memory module as a dielectric substance.

In another embodiment, each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane.

In another embodiment, a portion of the first conducting trace where the impedance-matching capacitive element is formed has a width that is wider than other portions of the first conducting trace.

In another embodiment, each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate.

In another embodiment, a portion of the first conducting trace where the impedance-matching capacitive element is formed has a width that is wider than other portions of the first conducting trace.

In another aspect, the present invention is directed to a memory system. The memory system includes one or more memory modules, each comprising: a plurality of semiconductor memory devices; a plurality of module tabs configured to transmit and receive signals between the one or more semiconductor memory devices and external devices; a data bus configured to transfer signals between data input/output pins of the one or more semiconductor memory devices and the plurality of module tabs; and impedance matching capacitive elements, each coupled between a line of the data bus and a reference voltage of the memory module. The memory system further includes a memory controller configured to control operations of the plurality of memory modules, and a main bus coupled between the memory controller and the module tabs of ht one or more memory modules.

In one embodiment, the main bus is disposed on a motherboard, and the data bus is disposed on a module board of the one or more memory modules.

In another embodiment, each line of the data bus includes an impedance-matching resistor.

In another embodiment, each of the impedance-matching capacitive elements includes a capacitor coupled to the corresponding line of the data bus between the impedance-matching resistor and the corresponding one of the one or more semiconductor memory devices.

In another embodiment, each of the impedance-matching capacitive elements includes a capacitor coupled to the corresponding line of the data bus between the impedance-matching resistor and the corresponding one of the plurality of module tabs.

In another embodiment, each of the impedance-matching capacitive elements comprises a discrete capacitor mounted on a PCB substrate of the memory module.

In another embodiment, each of the impedance-matching capacitive elements employs a PCB substrate of the memory module as a dielectric substance.

In another embodiment, each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane.

In another embodiment, a portion of the first conducting trace where the impedance-matching capacitive element is formed has a width that is wider than other portions of the first conducting trace.

In another embodiment, each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate.

In another embodiment, a portion of the first conducting trace where the impedance-matching capacitive element is formed has a width that is wider than other portions of the first conducting trace.

BRIEF DESCRIPTION OF THE DRAWINGS

The above and other features and advantages of the present invention will become more apparent when described in detailed example embodiments thereof with reference to the attached drawings in which.

DETAILED DESCRIPTION OF EMBODIMENTS OF THE INVENTION

Figure 1:
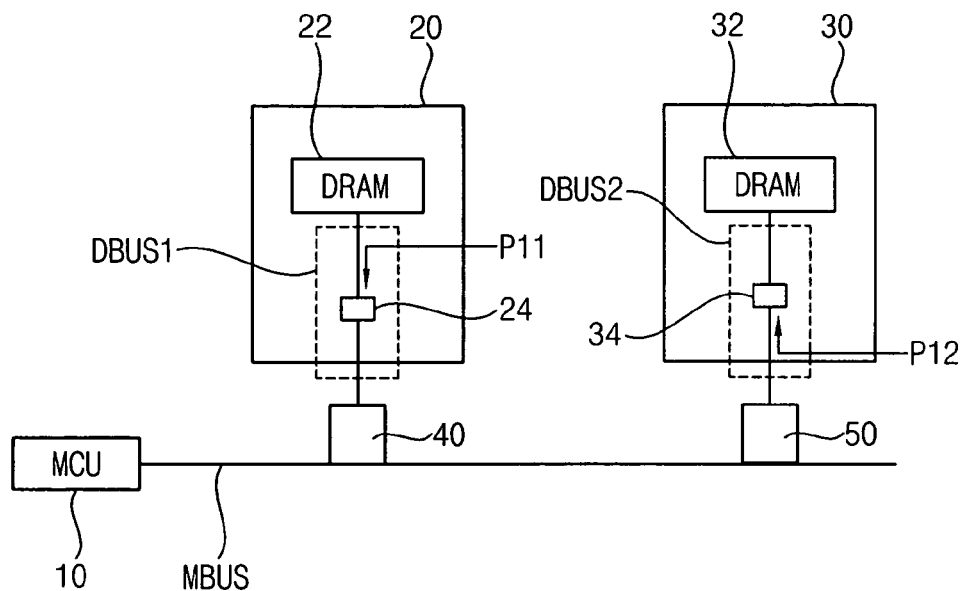
FIG. 1 is a schematic diagram illustrating a conventional memory system.
Figure 2A:
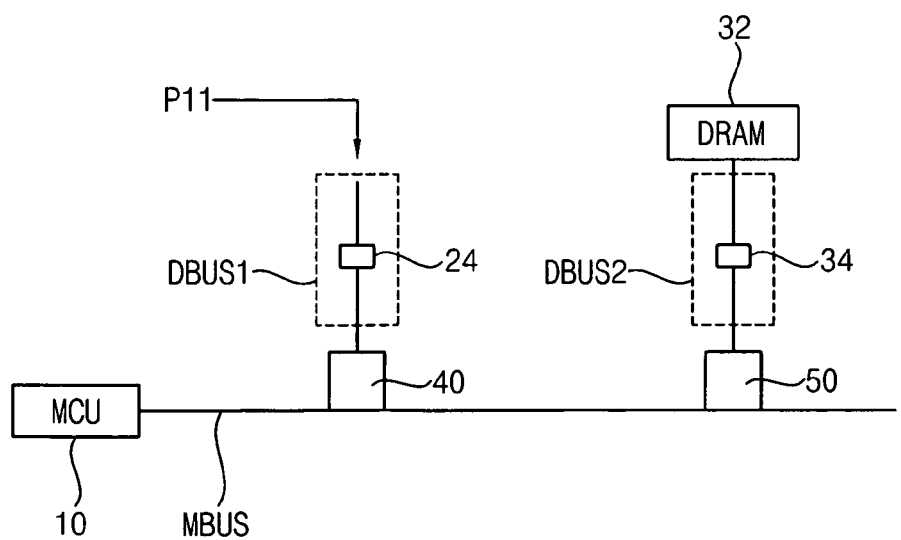
FIG. 2A is a schematic diagram illustrating a channel topology for measuring a degree of impedance matching of a memory system shown in FIG. 1 in read/write operation mode.
Figure 2B:
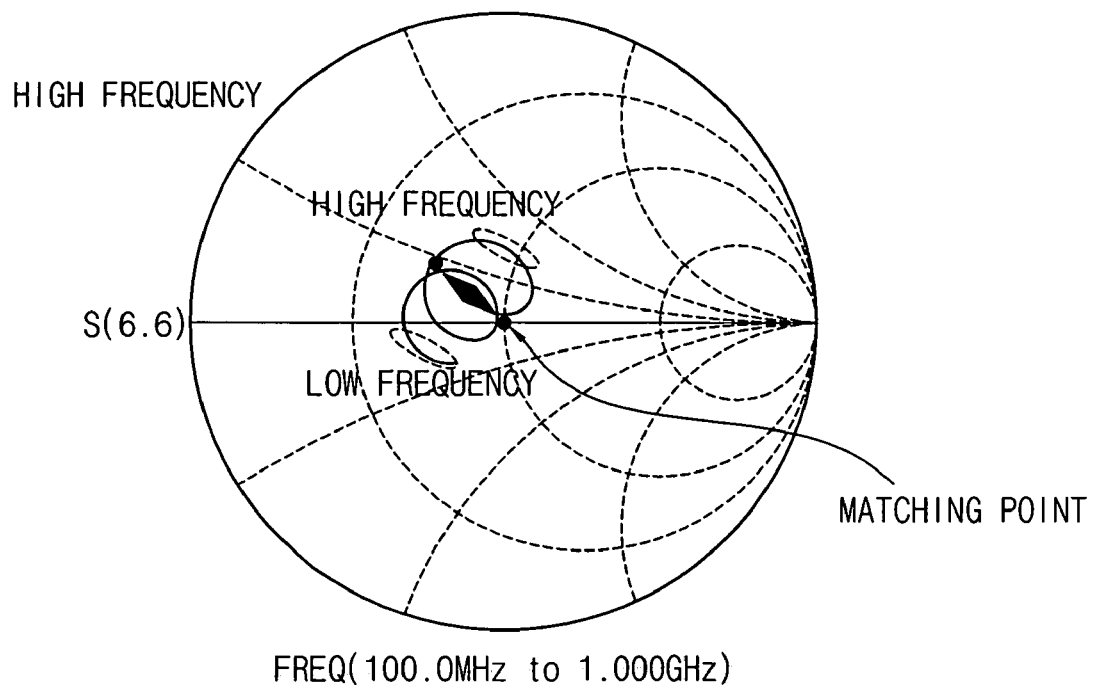
FIG. 2B is a smith chart illustrating the impedance viewed at port P11 shown in FIG. 2A.
Figure 3A:
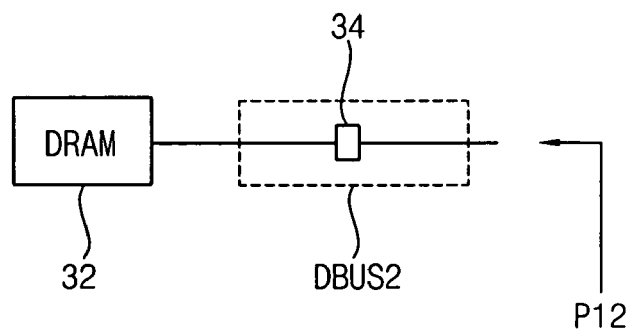
FIG. 3A is a schematic diagram illustrating a channel topology for measuring a degree of impedance matching of the memory system shown in FIG. 1 in on-die termination (ODT) operation mode.
Figure 3B:
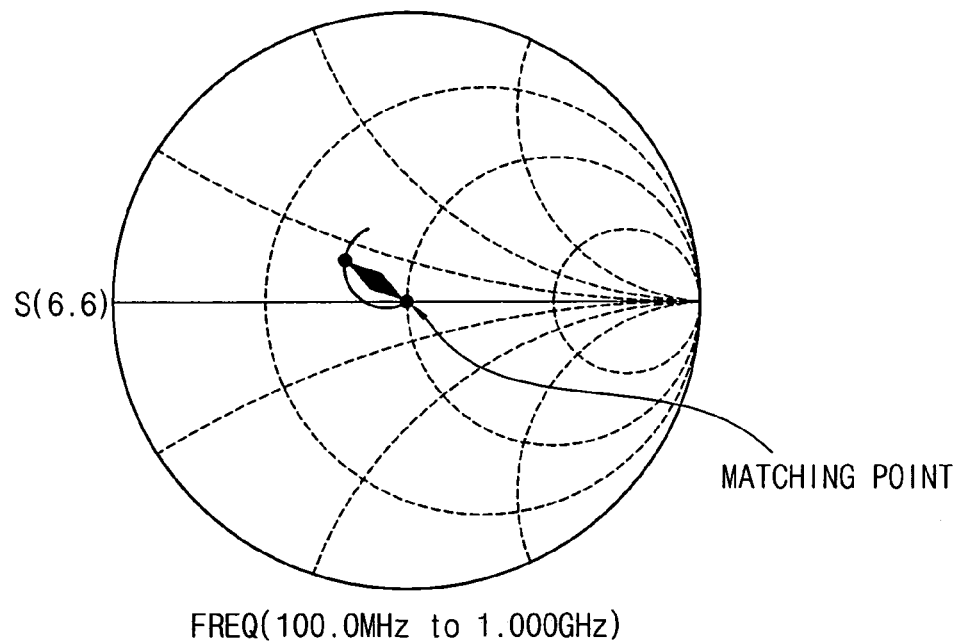
FIG. 3B is a smith chart illustrating the impedance viewed at port P12 shown in FIG. 3A.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
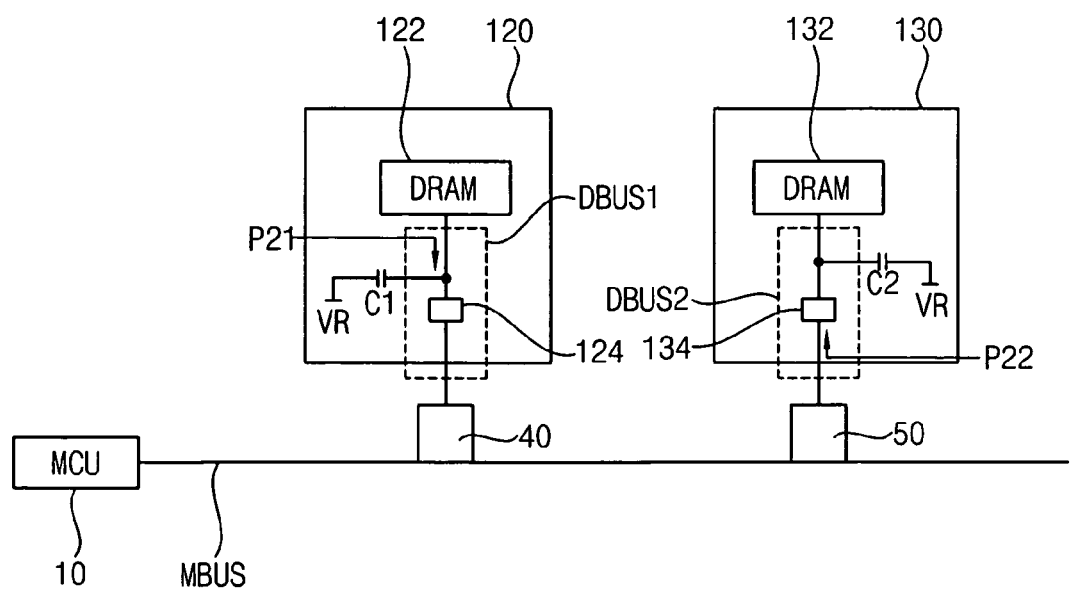
FIG. 4 is a schematic diagram illustrating a memory system according to an example embodiment of the present invention.

FIG. 4 is a schematic diagram illustrating a memory system according to an example embodiment of the present invention.

Referring to FIG. 4, the memory system includes a memory controller 10, a first memory module 120, a second memory module 130, and sockets 40 and 50 for coupling the memory controller 10 to each of the memory modules 120 and 130.

The memory modules 120 and 130 are electrically coupled to each of the sockets 40 and 50 through tabs (not shown) mounted on a circuit board of the memory module. The memory modules 120 and 130 respectively each include a semiconductor memory device, that is, a dynamic random access memory (DRAM) 122 and 132. In the example embodiment shown in FIG. 4, the memory system includes two memory modules; however, the memory system may include one or more memory modules. In addition, in the example embodiment shown in FIG. 4, the memory modules 120 and 130 respectively include a single semiconductor memory device 122 and 132; however, the memory modules 120 and 130 may include multiple semiconductor memory devices. The memory controller 10 is coupled to the sockets 40 and 50 through a main bus MBUS, and the sockets 40 and 50 are coupled to each of the data pins DQ (not shown) of the semiconductor memory devices 122 and 132 in the memory modules 120 and 130 through each of the data buses DBUS1 and DBUS2. The main bus MBUS is disposed on a motherboard (not shown), and the data buses DBUS1 and DBUS2 are disposed on module boards 120 and 130. The data buses DBUS1 and DBUS2 that electrically couple the main bus MBUS to the semiconductor memory devices 122 and 132 include a first capacitor C1 and a second capacitor C2 respectively so as to improve the signal integrity (SI) of signals being transferred on the data buses DBUS1, DBUS2. Additionally, the data buses DBUS1 and DBUS2 can include stub resistors 124 and 134 so as to improve the signal integrity (SI) of signals being transferred on the data buses DBUS1, DBUS2.

The capacitors C1 and C2, as shown in FIG. 4, may be in the form of discrete capacitors mounted on a printed circuit board (PCB) substrate, or may be capacitors implemented using a trace included in the data buses DBUS1 and DBUS2. In the present embodiment, a first terminal of each of the capacitors C1 and C2 is coupled to each of the data buses DBUS1 and DBUS2, and a second terminal of each of the capacitors C1 and C2 is coupled to a reference voltage VR. The reference voltage VR may be a low-power voltage level or a high-power voltage level that is provided to the semiconductor memory devices 122 and 132.

Figure 5A:
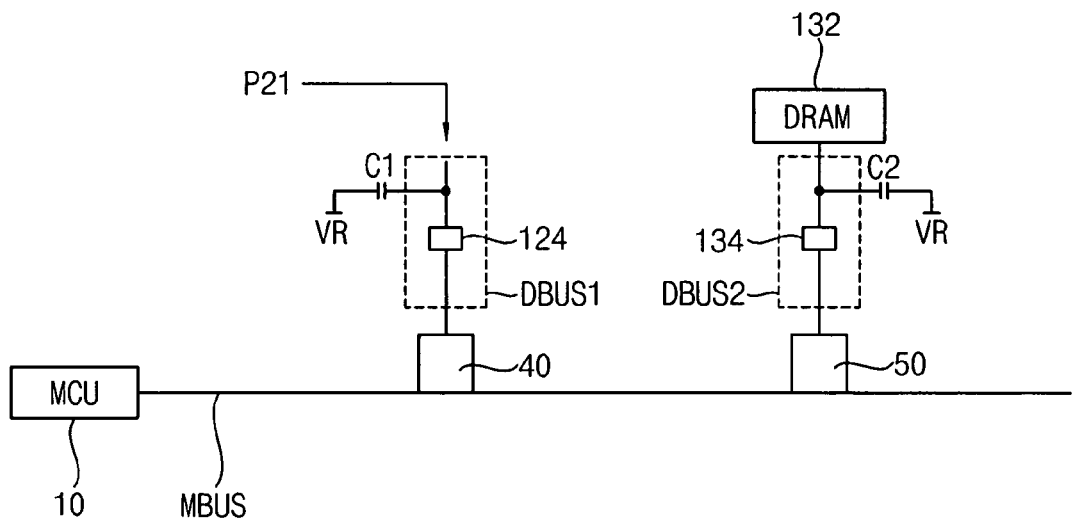
FIG. 5A is a schematic diagram illustrating a channel topology for measuring a degree of impedance matching of the memory system shown in FIG. 4 in read/write operation mode.

FIG. 5A is a schematic diagram illustrating a channel topology for measuring a degree of impedance matching of the memory system shown in FIG. 4 when the semiconductor memory device 122 in the memory module 120 operates in a read/write mode, and the semiconductor memory device 132 in the memory module 130 operates in an on-die termination (ODT) mode.

Figure 5B:
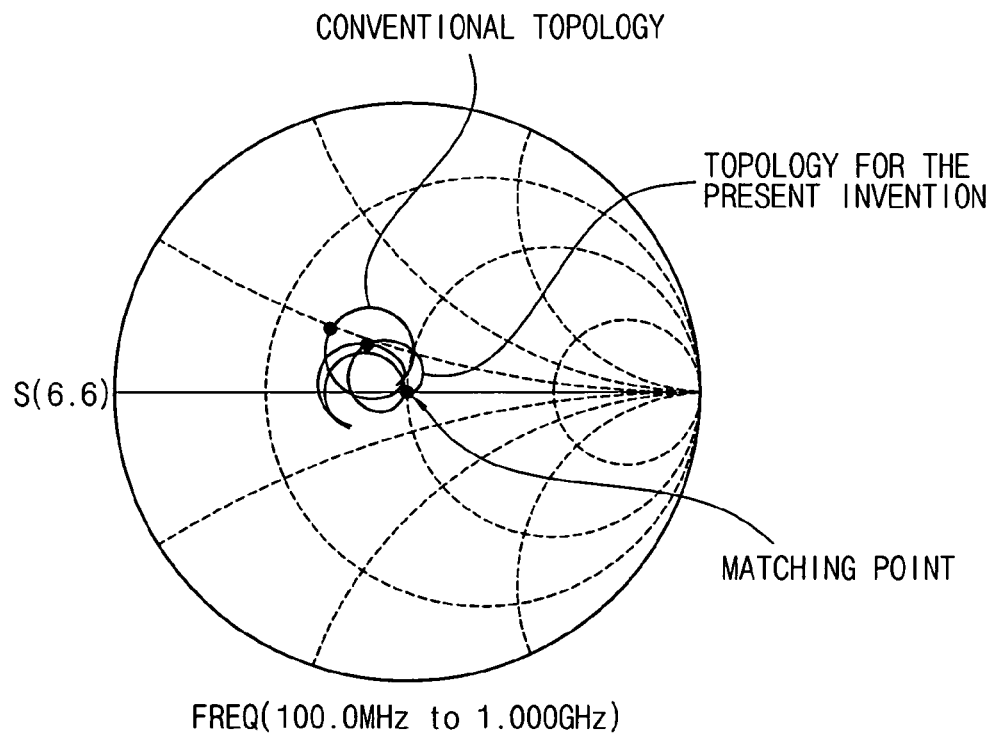
FIG. 5B is a smith chart illustrating the impedance viewed at port P21 shown in FIG. 5A.

FIG. 5B is a smith chart illustrating the impedance viewed at port P21 shown in FIG. 5A. The smith chart shown in FIG. 5B shows a simulation result in a case where the capacitors C1 and C2 both have a capacitance value of about 1.5 pF, respectively, the stub resistors 124 and 134 both have a resistance value of about 20Ω, respectively, ODT resistors included in the DRAM 122 and 132 both have a resistance value of about 50Ω, and the data buses DBUS1 and DBUS2 both have a resistance value of about 60Ω, respectively.

Referring to the smith chart shown in FIG. 5B, impedance in a read/write operation mode of the memory system shown in FIG. 4, at a high frequency, according to an example embodiment of the present invention, is closer to a matching point, as compared with the impedance of the conventional memory system shown in FIG. 1.

Figure 6A:
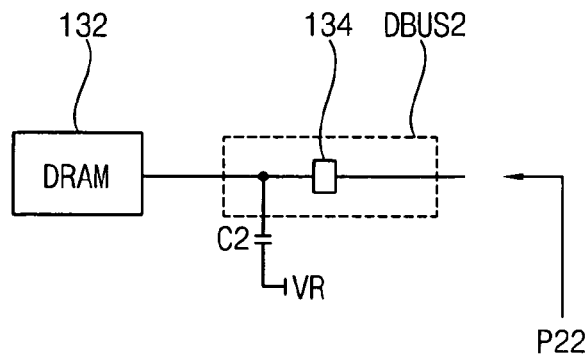
FIG. 6A is a schematic diagram illustrating a channel topology for measuring a degree of impedance matching of the memory system shown in FIG. 4 in ODT operation mode.

FIG. 6A is a schematic diagram illustrating a channel topology for measuring a degree of impedance matching of a memory system shown in FIG. 4 when the semiconductor memory device 122 in the memory module 120 operates in the read/write mode, and the semiconductor memory device 132 in the memory module 130 operates in the ODT mode.

Figure 6B:
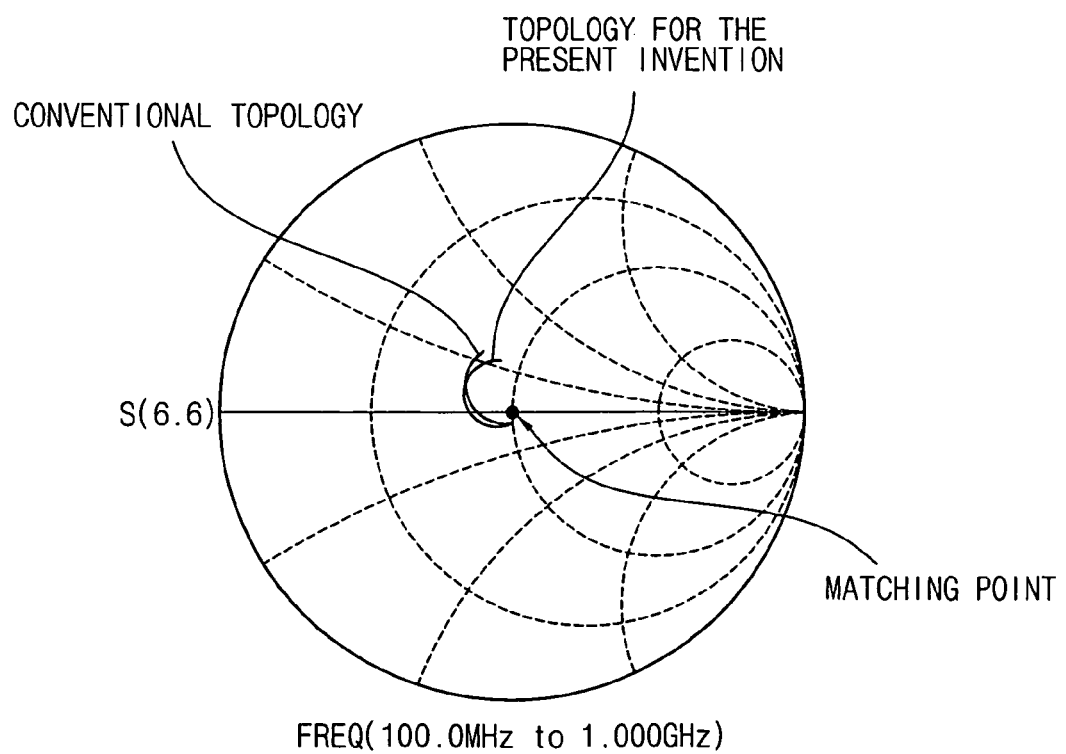
FIG. 6B is a smith chart illustrating the impedance viewed at port P22 shown in FIG. 6A.

FIG. 6B is a smith chart illustrating the impedance viewed at port P22 shown in FIG. 6A. Referring to the smith chart shown in FIG. 6B, impedance in the ODT mode of the memory system shown in FIG. 4, at a high frequency, according to an example embodiment of the present invention, is closer to a matching point, as compared with the impedance of the conventional memory system shown in FIG. 1.

Figure 7A:
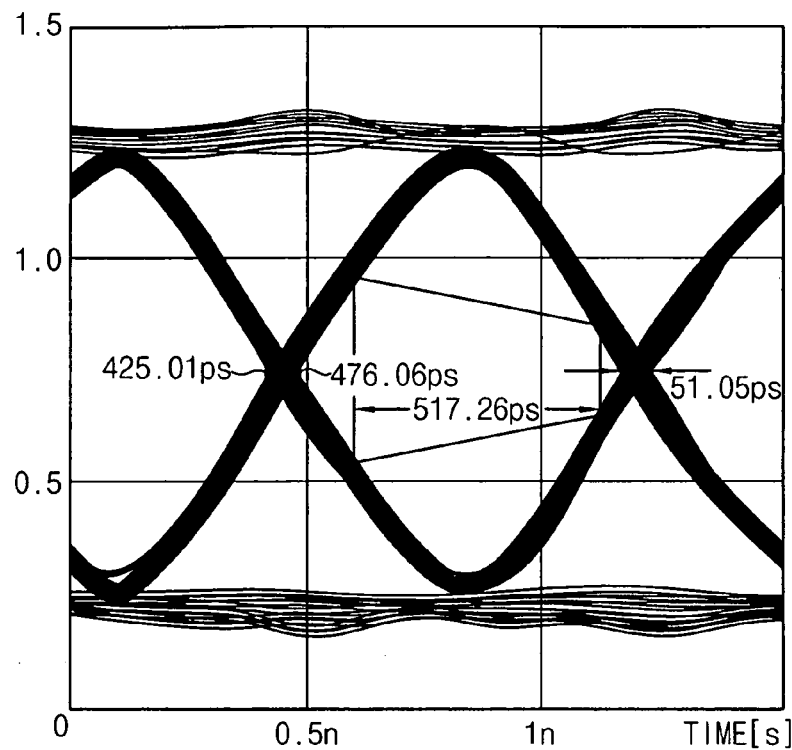
FIG. 7A is an eye diagram illustrating an eye opening and a skew of the conventional memory system shown in FIG. 1 in a memory write operation.
Figure 7B:
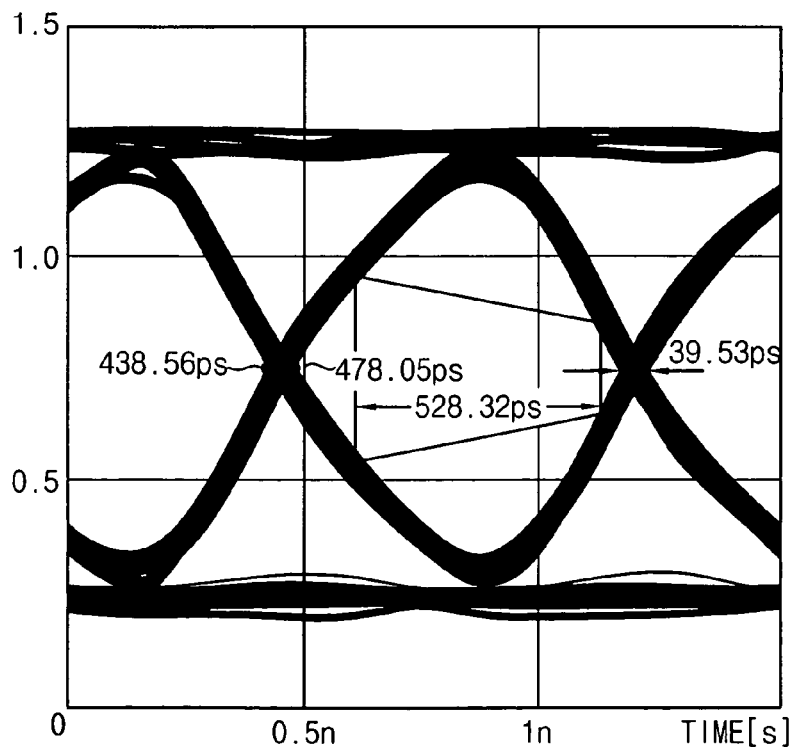
FIG. 7B is an eye diagram illustrating an eye opening and a skew of the memory system shown in FIG. 4 according to an example embodiment of the present invention in a memory write operation.

FIG. 7A is an eye diagram illustrating an eye opening and a skew of the conventional memory system shown in FIG. 1 in a memory write operation, and FIG. 7B is an eye diagram illustrating an eye opening and a skew of the memory system shown in FIG. 4 according to an example embodiment of the present invention in a memory write operation.

Referring to FIGS. 7A and 7B, during the memory write operation, the memory system shown in FIG. 4 has an eye opening larger than that of the conventional memory system shown in FIG. 1 by as much as about 11 ps (since the eye opening of the memory system shown in FIG. 4 is about 528.32 ps and the eye opening of the conventional memory system shown in FIG. 1 is about 517.26 ps). In addition, the memory system shown in FIG. 4 has a signal skew smaller than that of the conventional memory system shown in FIG. 1 by as much as about 12 ps (since the signal skew of the memory system shown in FIG. 4 is about 39.53 ps and the signal skew of the conventional memory system shown in FIG. 1 is about 51.05 ps). In other words, the memory system shown in FIG. 4 has a more improved signal integrity (SI) than that of the conventional memory system shown in FIG. 1 during the memory write operation.

Figure 8A:
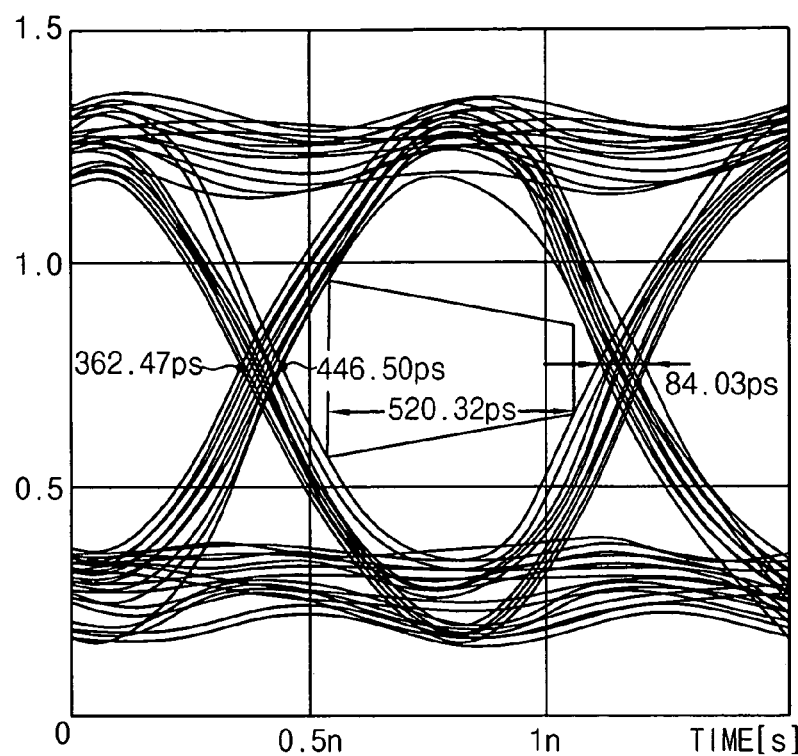
FIG. 8A is an eye diagram illustrating an eye opening and a skew of the conventional memory system shown in FIG. 1 in a memory read operation.
Figure 8B:
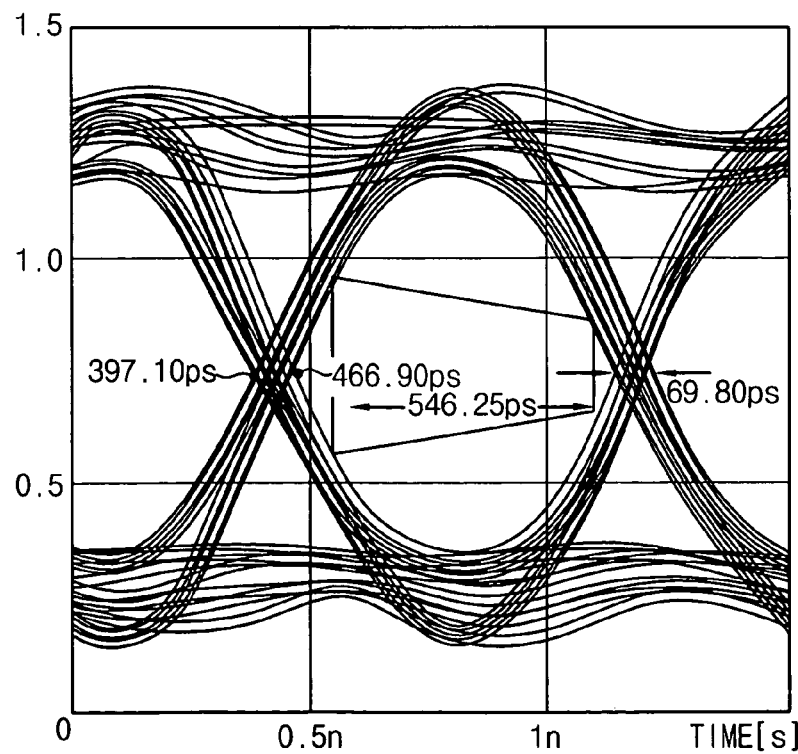
FIG. 8B is an eye diagram illustrating an eye opening and a skew of the memory system shown in FIG. 4 according to an example embodiment of the present invention in a memory read operation.

FIG. 8A is an eye diagram illustrating an eye opening and a skew of the conventional memory system shown in FIG. 1 in a memory read operation, and FIG. 8B is an eye diagram illustrating an eye opening and a skew of the memory system shown in FIG. 4 according to an example embodiment of the present invention in a memory read operation.

Referring to FIGS. 8A and 8B, during the memory read operation, the memory system shown in FIG. 4 has an eye opening larger than that of the conventional memory system shown in FIG. 1 by as much as about 26 ps (since the eye opening of the memory system shown in FIG. 4 is about 546.25 ps and the eye opening of the conventional memory system shown in FIG. 1 is about 520.32 ps). In addition, the memory system shown in FIG. 4 has a signal skew smaller than that of the conventional memory system shown in FIG. 1 by as much as about 12 ps (since the signal skew of the memory system shown in FIG. 4 is about 69.80 ps and the signal skew of the conventional memory system shown in FIG. 1 is about 84.03 ps). In other words, the memory system shown in FIG. 4 has a more improved signal integrity (SI) than that of the conventional memory system shown in FIG. 1 during the memory read operation.

Figure 9:
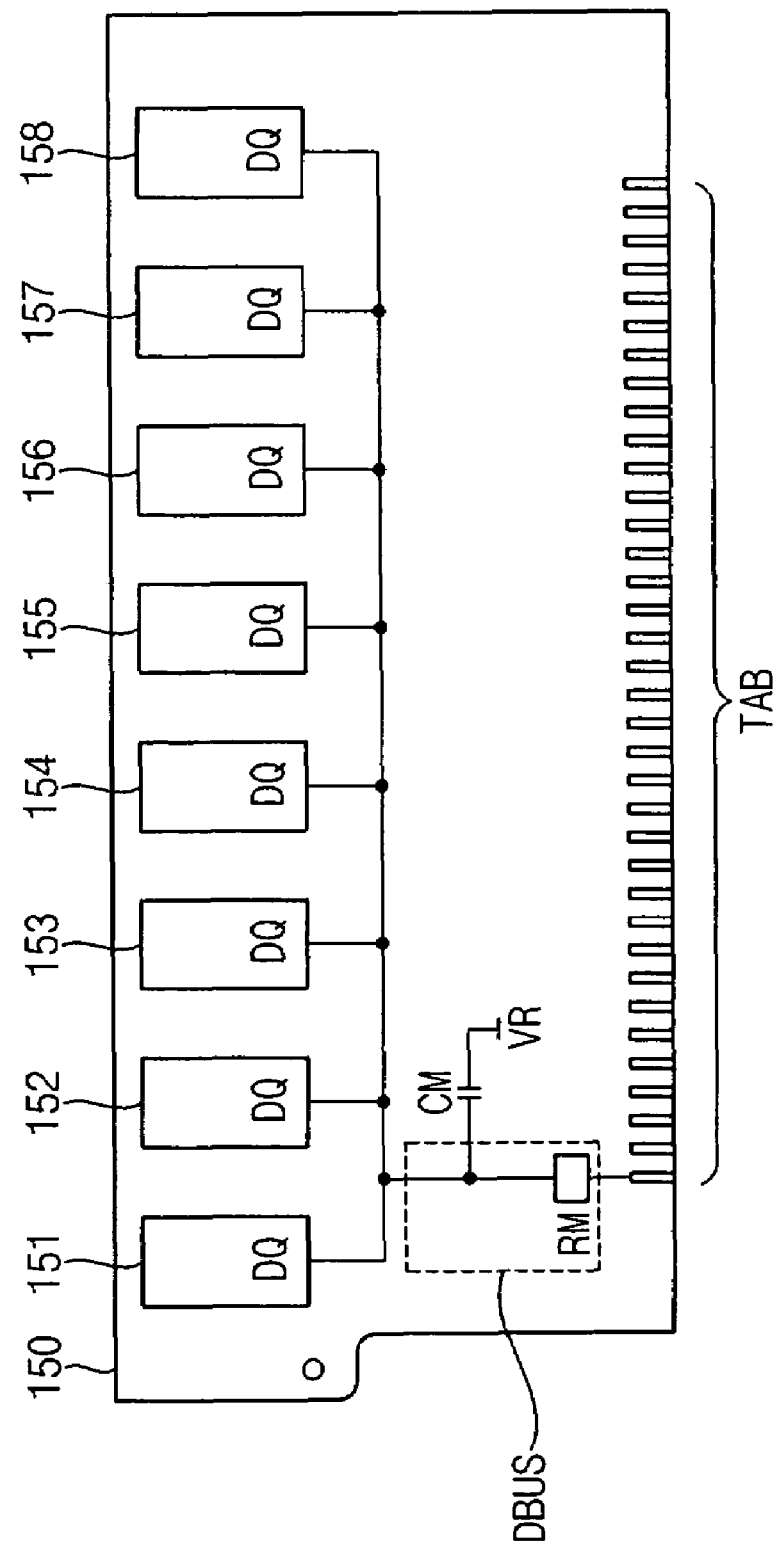
FIG. 9 is a schematic diagram illustrating a memory module included in the memory system shown in FIG. 4 according to an example embodiment of the present invention.

FIG. 9 is a schematic diagram illustrating a memory module included in the memory system shown in FIG. 4 according to an example embodiment of the present invention.

Referring to FIG. 9, the memory module includes semiconductor memory devices 151 through 158, module tabs for transmitting/receiving signals to/from external devices, a data bus DBUS and a capacitor CM coupled between the data bus DBUS and a reference voltage VR. The data bus DBUS may include a resistor RM, for further controlling impedance matching, disposed between conducting wires.

The semiconductor memory devices 151 through 158 output data to external devices or read data from external devices, and are mounted on a printed circuit board (PCB) substrate 150. The data bus DBUS transfers signals between data input/output pins DQ in the semiconductor memory devices 151 through 158 and the module tabs, and may include the resistor RM for controlling impedance.

The capacitor CM can comprise, for example, a discrete capacitor mounted on the PCB substrate 150 or can comprise a capacitor implemented using a trace included in the data bus DBUS. A first terminal of the capacitor CM is coupled to the data bus DBUS, and a second terminal of the capacitor CM is coupled to the reference voltage VR. The reference voltage VR may be a low-power voltage or a high-power voltage level that is provided to the semiconductor memory devices 151 through 158, or other voltage level available on the module.

Figure 10A:
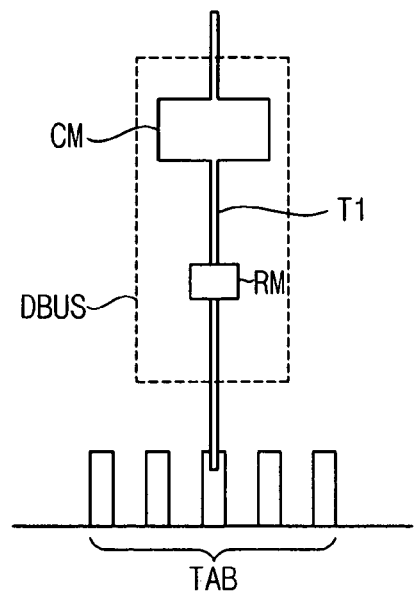
FIGS. 10A and 10B are schematic diagrams illustrating a data bus including a capacitor implemented using a trace of a data bus.
Figure 10B:
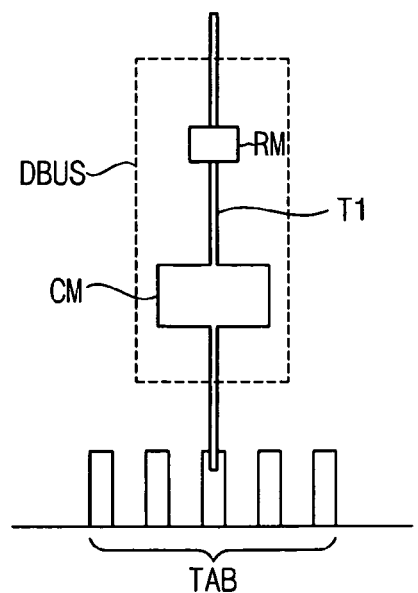

FIGS. 10A and 10B are schematic diagrams illustrating a data bus including a capacitor implemented using a trace of a data bus.

Referring to FIGS. 10A and 10B, the data bus DBUS is coupled to a module tap, and includes a capacitor CM and a resistor RM. FIG. 10A shows the data bus DBUS including the capacitor CM disposed between the semiconductor memory device (not shown) and the resistor RM, and FIG. 10B shows the data bus DBUS including the capacitor CM disposed between the module tab and the resistor RM.

A conducting wire of a portion where the capacitor CM is formed has a width wider than other portions of the conducting wire. A trace of the data bus DBUS, i.e., a conducting wire T1 is a first terminal of the capacitor CM, and a conducting wire, (not shown) disposed on the PCB substrate 150 shown in FIG. 9 opposite to a plane where the data bus DBUS is disposed, is a second terminal of the capacitor CM. Alternatively, the conducting wire T1 included in the data bus DBUS may be a first terminal of the capacitor CM, and a conducting wire (not shown) disposed in the PCB substrate 150 shown in FIG. 9 may be a second terminal of the capacitor CM. The second terminal of the capacitor CM may be coupled to a low-power voltage, i.e., ground or a high-power voltage VDD, or other voltage level of the module.

As shown in FIGS. 10A and 10B, when a discrete capacitor is not used, but instead the PCB substrate 150 shown in FIG. 9 is used as a dielectric substance, and the conducting wire T1 included in the data bus DBUS is used for one terminal of the capacitor CM, the configuration of the module board can be simplified.

Figure 11:
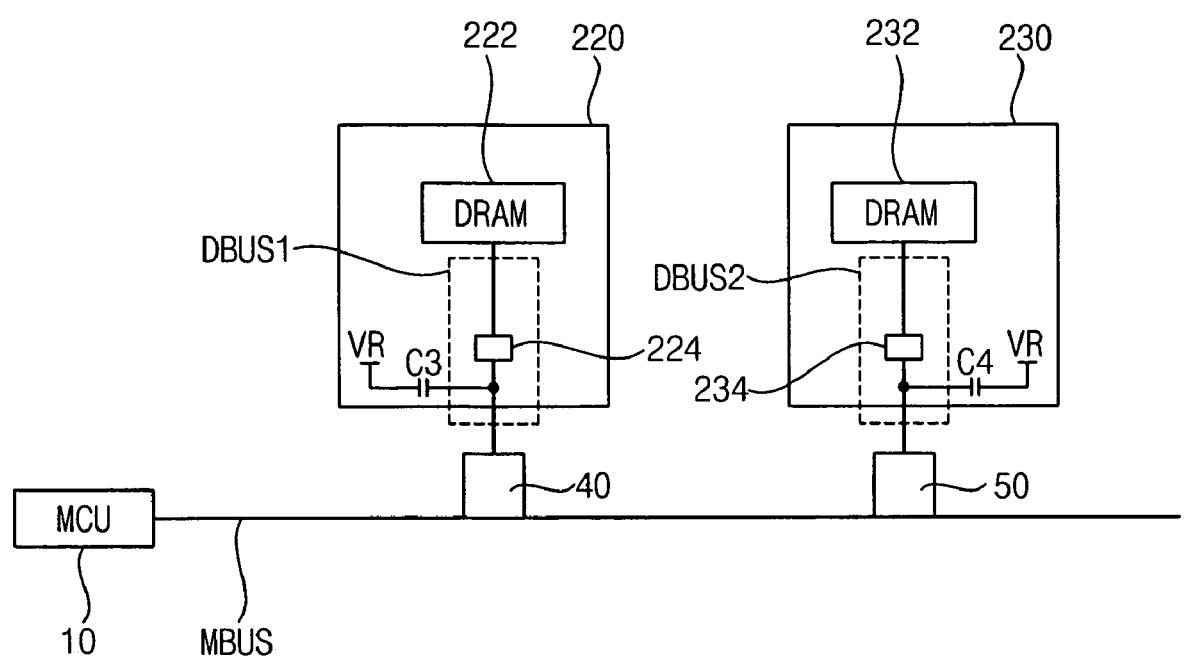
FIG. 11 is a schematic diagram illustrating a memory system according to another example embodiment of the present invention.

FIG. 11 is a schematic diagram illustrating a memory system according to another example embodiment of the present invention.

Unlike the memory system shown in FIG. 4, the memory system shown in FIG. 11 includes capacitors C3 and C4 for controlling impedance that are coupled between a module tab (not shown) and resistors 224 and 234. A main bus MBUS shown in FIG. 11 is disposed on a motherboard (not shown), and the data buses DBUS1 and DBUS2 are disposed on module boards 220 and 230. The memory system shown in FIG. 11 is identical with that shown in FIG. 4 except that the placements of the capacitors C3 and C4 included in the data buses DBUS1 and DBUS2, respectively, are different than the placement of the capacitors C1, C2 of the memory system shown in FIG. 4. Thus, detailed description of the memory system shown in FIG. 11 is omitted.

In the example embodiments of the present invention, the memory system includes two memory modules; however, the present invention may be applicable for a memory system having one, or more than two, memory modules.

As described above, the memory module and the memory system according to example embodiments of the present invention may achieve impedance matching of the memory system by including a capacitor, for impedance matching, that is connected to the data bus in each of the memory modules included in the memory system. Additionally, the memory module and the memory system according to example embodiments of the present invention provide improved signal integrity (SI).

Furthermore, the memory module and the memory system according to example embodiments of the present invention achieve improved impedance matching when operating in the read/write mode or the ODT mode by including a stub resistor and a capacitor disposed on the data bus. Accordingly, the memory module and the memory system according to example embodiments of the present invention can reduce signal distortion due to reflection and increase the energy of a signal; thus, signal integrity (SI) can be improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A memory module comprising:
   one or more semiconductor memory devices;
   a plurality of module tabs configured to transmit and receive signals between the one or more semiconductor memory devices and external devices;
   a data bus comprising a plurality of lines, each line coupled between a module tab of the plurality of module tabs and a data input/output pin of a memory device of the one or more semiconductor memory devices, and each line configured to transfer signals between the data input/output pin of the memory device of the one or more semiconductor memory devices and the module tab of the plurality of module tabs; and
   impedance-matching capacitive elements, each coupled between the line of the data bus and a reference voltage.

2. The memory module of claim 1, wherein each line of the data bus includes an impedance-matching resistor.

3. The memory module of claim 1, wherein the reference voltage is a relatively low voltage level provided to the one or more semiconductor memory devices.

4. The memory module of claim 1, wherein the reference voltage is a relatively high voltage level provided to the one or more semiconductor memory devices.

5. The memory module of claim 1, wherein each of the impedance-matching capacitive elements comprises a discrete capacitor mounted on a PCB substrate of the memory module.

6. The memory module of claim 1, wherein each of the impedance-matching capacitive elements employs a PCB substrate of the memory module as a dielectric substance.

7. The memory module of claim 2, wherein each of the impedance-matching capacitive elements includes a capacitor coupled to the corresponding line of the data bus between the impedance-matching resistor and the corresponding one of the one or more semiconductor memory devices.

8. The memory module of claim 2, wherein each of the impedance-matching capacitive elements includes a capacitor coupled to the corresponding line of the data bus between the impedance-matching resistor and the corresponding one of the plurality of module tabs.

9. The memory module of claim 6, wherein each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane.

10. The memory module of claim 6, wherein each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate.

11. The memory module of claim 9, wherein a portion of the first conducting trace where the impedance-matching capacitive element is formed has a width that is wider than other portions of the first conducting trace.

12. The memory module of claim 10, wherein a portion of the first conducting trace where the impedance-matching capacitive element is formed has a width that is wider than other portions of the first conducting trace.

13. A memory system comprising:
   one or more memory modules, each comprising:
      one or more semiconductor memory devices;
      a plurality of module tabs configured to transmit and receive signals between the one or more semiconductor memory devices and external devices;
      a data bus comprising a plurality of lines, each line coupled between a module tab of the plurality of module tabs and a data input/output pin of a memory device of the one or more semiconductor memory devices, and each line configured to transfer signals between the data input/output pin of the memory device of the one or more semiconductor memory devices and the module tab of the plurality of module tabs; and
      impedance-matching capacitive elements, each coupled between the line of the data bus and a reference voltage of the memory module;
   a memory controller configured to control operations of the plurality of memory modules; and
   a main bus coupled between the memory controller and the module tabs of the one or more memory modules.

14. The memory system of claim 13, wherein the main bus is disposed on a motherboard, and the data bus is disposed on a module board of the one or more memory modules.

15. The memory system of claim 13, wherein each line of the data bus includes an impedance-matching resistor.

16. The memory system of claim 15, wherein each of the impedance-matching capacitive elements includes a capacitor coupled to the corresponding line of the data bus between the impedance-matching resistor and the corresponding one of the plurality of module tabs.

17. The memory system of claim 13, wherein each of the impedance-matching capacitive elements comprises a discrete capacitor mounted on a PCB substrate of the memory module.

18. The memory system of claim 13, wherein each of the impedance-matching capacitive elements employs a PCB substrate of the memory module as a dielectric substance.

19. The memory system of claim 15, wherein each of the impedance-matching capacitive elements includes a capacitor coupled to the corresponding line of the data bus between the impedance-matching resistor and the corresponding one of the one or more semiconductor memory devices.

20. The memory system of claim 18, wherein each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane.

21. The memory system of claim 18, wherein each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate.

22. The memory system of claim 20, wherein a portion of the first conducting trace where the impedance-matching capacitive element is formed has a width that is wider than other portions of the first conducting trace.

23. The memory system of claim 21, wherein a portion of the first conducting trace where the impedance-matching capacitive element is formed has a width that is wider than other portions of the first conducting trace.

24. A memory module comprising:
one or more semiconductor memory devices;
a plurality of module tabs configured to transmit and receive signals between the one or more semiconductor memory devices and external devices;
a data bus configured to transfer signals between data input/output pins of the one or more semiconductor memory devices and the plurality of module tabs; and
impedance-matching capacitive elements, each coupled between a line of the data bus and a reference voltage, wherein each of the impedance-matching capacitive elements employs a PCB substrate of the memory module as a dielectric substance, wherein each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane.

25. The memory module of claim 24, wherein a portion of the first conducting trace where the impedance-matching capacitive element is formed has a width that is wider than other portions of the first conducting trace.

26. A memory module comprising:
one or more semiconductor memory devices;
a plurality of module tabs configured to transmit and receive signals between the one or more semiconductor memory devices and external devices;
a data bus configured to transfer signals between data input/output pins of the one or more semiconductor memory devices and the plurality of module tabs; and
impedance-matching capacitive elements, each coupled between a line of the data bus and a reference voltage, wherein each of the impedance-matching capacitive elements employs a PCB substrate of the memory module as a dielectric substance, wherein each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate.

27. The memory module of claim 26, wherein a portion of the first conducting trace where the impedance-matching capacitive element is formed has a width that is wider than other portions of the first conducting trace.

28. A memory system comprising:
one or more memory modules, each comprising:
a plurality of semiconductor memory devices;
a plurality of module tabs configured to transmit and receive signals between the one or more semiconductor memory devices and external devices;
a data bus configured to transfer signals between data input/output pins of the one or more semiconductor memory devices and the plurality of module tabs; and
impedance-matching capacitive elements, each coupled between a line of the data bus and a reference voltage of the memory module, wherein each of the impedance-matching capacitive elements employs a PCB substrate of the memory module as a dielectric substance, wherein each of the impedance-matching capacitive elements is provided between a first conducting trace of the data bus disposed on a first plane of the PCB substrate, and a second conducting trace disposed on a second plane of the PCB substrate and coupled to the reference voltage, the first plane and the second plane having PCB substrate material between them, and wherein the second plane is on a surface of the PCB substrate that is opposite a surface of the first plane;
a memory controller configured to control operations of the plurality of memory modules; and
a main bus coupled between the memory controller and the module tabs of the one or more memory modules.

29. The memory system of claim 28, wherein a portion of the first conducting trace where the impedance-matching capacitive element is formed has a width that is wider than other portions of the first conducting trace.

30. A memory system comprising:
one or more memory modules, each comprising:
a plurality of semiconductor memory devices;
a plurality of module tabs configured to transmit and receive signals between the one or more semiconductor memory devices and external devices;
a data bus configured to transfer signals between data input/output pins of the one or more semiconductor memory devices and the plurality of module tabs; and
impedance-matching capacitive elements, each coupled between a line of the data bus and a reference voltage of the memory module, wherein each of the impedance-matching capacitive elements employs a PCB substrate of the memory module as a dielectric substance, wherein each of the impedance-matching capacitive elements is provided between a first conducting trace of the data bus disposed on a plane of the PCB substrate, and a second conducting trace disposed in the PCB substrate and coupled to the reference voltage, the first plane and the second plane having PCB substrate material between them, and wherein the second plane is embedded in the PCB substrate; a memory controller configured to control operations of the plurality of memory modules; and a main bus coupled between the memory controller and the module tabs of the one or more memory modules.

31. The memory system of claim 30, wherein a portion of the first conducting trace where the impedance-matching capacitive element is formed has a width that is wider than other portions of the first conducting trace.

* * * * *